United States Patent [19]

Lantz

[11] Patent Number: 5,175,543
[45] Date of Patent: Dec. 29, 1992

[54] DICTIONARY RESET PERFORMANCE ENHANCEMENT FOR DATA COMPRESSION APPLICATIONS

[75] Inventor: Carl B. Lantz, Corvallis, Oreg.

[73] Assignee: Hewlett-Packard Company, Palo Alto, Calif.

[21] Appl. No.: 766,475

[22] Filed: Sep. 25, 1991

[51] Int. Cl.⁵ ............................................... H03M 7/30
[52] U.S. Cl. ...................................... 341/51; 341/106
[58] Field of Search ...................... 341/51, 106, 52, 55, 341/87, 94, 95, 90; 358/261.2, 261.4, 430

[56] References Cited

U.S. PATENT DOCUMENTS

| | | |
|---|---|---|
| 4,464,650 | 8/1984 | Eastman et al. |
| 4,558,302 | 12/1985 | Welch |
| 4,814,746 | 3/1989 | Miller et al. |
| 4,843,389 | 6/1989 | Lisle et al. .......................... 341/106 |
| 4,847,619 | 7/1989 | Kato et al. |
| 4,876,541 | 10/1989 | Storer .................................. 341/51 |
| 5,003,307 | 3/1991 | Whiting et al. |
| 5,016,009 | 5/1991 | Whiting et al. |

OTHER PUBLICATIONS

Product Specification AHA3101, Data Compression Coprocessor IC, Advanced Hardware Architectures, Inc., Moscow, Idaho, Nov., 1990.

*Primary Examiner*—A. D. Pellinen
*Assistant Examiner*—B. K Young

[57] ABSTRACT

A class of lossless data compression algorithms use a RAM-based dictionary to facilitate the compression and decompression of data. The dictionary is initialized or reset at various events, such as data file boundaries, or at specific compression ratio thresholds. The average time to perform the dictionary reset is decreased by using a dictionary reset optimizer (12) to reset the dictionary without writing the DICT_VALID fields (19) of all dictionary locations (1,2,3, . . . L) immediately upon each reset. The DICT_VALID field in static RAM (16) is set up as an N-bit field and the optimizer includes a counter (20) for generating an N-bit DICT_NUMBER field (22) under control of a controller (24) responsive to reset signals. During operation to compress/decompress data after a reset, the DICT_VALID field of a dictionary location is compared to the current DICT_NUMBER (1). If their values are equal, the DICT_ENTRY field (18) in such location is deemed valid. Otherwise, the DICT_ENTRY field is rewritten with new compression data and the DICT_VALID field is reset equal to the current DICT_NUMBER (1). Upon each reset, the counter is incremented to provide a new DICT_NUMBER (2) whose value will no longer match current DICT_VALID values stored in the dictionary locations.

21 Claims, 3 Drawing Sheets

DICTIONARY RESET PERFORMANCE ENHANCEMENT FOR DATA COMPRESSION APPLICATIONS

BACKGROUND OF THE INVENTION

This invention relates generally to data compression and decompression methods and apparatus, and more particularly to implementations of lossless data compression algorithms which use a dictionary to store compression and decompression information.

One widely-used example of a compression algorithm that uses a dictionary to store compression and decompression information is the second method of Lempel and Ziv, called LZ2. The dictionary is first initialized or reset. It is then built, by creating valid dictionary entries, as the incoming data is compressed/decompressed. Once a dictionary entry is created, it remains valid, until the entire dictionary is reset. An earlier method, LZ1, only maintains a finite most recent subset of entries. These methods are disclosed in U.S. Pat. No. 4,464,650 to Eastman et al., and various improvements in the algorithms are disclosed in U.S. Pat. Nos. 4,558,302 to Welch and 4,814,746 to Miller et al.

Integrated circuit implementations of the LZ2 algorithm typically store the dictionary in static RAM, as shown in FIG. 1 and described in further detail in the AHA3101 Data Compression Coprocessor IC Product Specification published November 1990 by Advanced Hardware Architectures, Inc., Moscow ID. The circuit of FIG. 1 has two parts—a data compressor engine implemented in an integrated circuit (IC) 5, and a static random access memory (RAM) 6. During compression, the data compression engine 7 reads uncompressed data on the DATA IN port. This data is compressed by the data compression engine, which uses the dictionary in the static RAM as part of the compression process. The data compression engine outputs compressed data on the DATA OUT port.

The process of data compression involves matching a sequence of input data bytes with the same sequence already encoded in a valid dictionary location. When this occurs, a compressed code word is output in place of the uncompressed sequence of input data bytes. In order to increase data throughput performance, a hashing algorithm is used to perform the matching function. In order to have an efficient hashing algorithm, the number of valid dictionary locations in the static RAM is much larger than the maximum number of valid dictionary entries. A factor of two to four is typical.

The data compression engine 7 provides the address for the dictionary location (1, 2, 3, ... L) to be accessed, as well as the read and write control signals to the static RAM. Each dictionary location contains two fields. The first field 8 contains the dictionary entry information, and is called DICT_ENTRY. The DICT_ENTRY field stores the sequences of input bytes already encountered, and their corresponding compressed codeword. The second field 9 is called the DICT_VALID field, and is conventionally a one-bit field. This field designates a dictionary location as either in the reset state, or in the valid state to indicate whether the DICT_ENTRY field 8 contains a valid dictionary entry.

When the DICT_VALID field 9 is in the reset state, the contents of the DICT_ENTRY field 8 are undefined, and do not contain useful information for the data compression engine. When the DICT_VALID field is in the valid state, the contents of the DICT_ENTRY field have already been written by the data compression engine. When the data compression engine writes to a dictionary location, the DICT_VALID field is always set to the valid state.

The statistical characteristics of the data may change over time, such as when different kinds of data are transmitted in succession, or over the course of transmitting a long document. When this happens, the stored dictionary entries will no longer efficiently compress the data. Then, it becomes necessary to reset and rebuild the dictionary. Commonly-assigned U.S. Pat. No. 4,847,619 discloses a method for monitoring compression efficiency and triggering a reset when performance falls below a predetermined threshold.

The process of resetting the dictionary involves writing to all dictionary locations, to put the DICT_VALID bit 9 of each location in the reset state. This must be done every time that the dictionary is reset. Let the number of dictionary locations be called L. Therefore, the number of static RAM write operations is also L. The amount of time to perform a total of L static RAM write operations is significant. This operation degrades the average data throughput during compression and decompression sequences involving multiple dictionary resets.

Accordingly, a need remains for a way to improve the performance of dictionary-based data compression engines.

SUMMARY OF THE INVENTION

It is, therefore, an object of the invention to improve the average data throughput of a dictionary-based data compression engine during compression and decompression sequences involving multiple dictionary resets.

Another object of the invention as aforementioned is to speed up dictionary reset operations.

The invention is a dictionary reset optimizer, preferably implemented as a part of the data compression engine in an integrated circuit, to be used in combination with a static RAM or other suitable memory device. A first aspect of the invention in the dictionary reset optimizer is to change the DICT_VALID field from a field with a single bit, to a field with multiple bits. A second aspect of the invention is to use the multiple bit DICT_VALID field to eliminate multiple writes to the static RAM dictionary during dictionary resets.

The function of the dictionary reset optimizer is to reduce the number of times that the DICT_VALID field in the dictionary needs to be written to the reset state during each reset operation. This is done by comparing the value stored in the multibit DICT_VALID field to a value stored in the data compression engine to see if the values match. As long as they match, the DICT_VALID field is defined to be in the valid state, meaning that the contents of the associated DICT_ENTRY field have already been written by the data compression engine. When they do not match, the dictionary is defined to be in a reset state. Whenever a reset is required, the value stored in the dictionary reset optimizer is changed so that a match will no longer be made at each location in the dictionary. Each DICT_ENTRY field can then be written by the data compression engine in accordance with the compression algorithm, at which time the DICT_VALID field is placed in the valid state by being changed to match the current value stored in the data compression engine. The result is to eliminate a significant number of dictionary write cycles to the static RAM, and thus increase the average data throughput during compression and decompression sequences with multiple dictionary resets.

The foregoing and other objects, features and advantages of the invention will become more readily apparent from the following detailed description of a preferred embodiment which proceeds with reference to the drawings.

DETAILED DESCRIPTION

Invention Implementation Example

Figure 1:
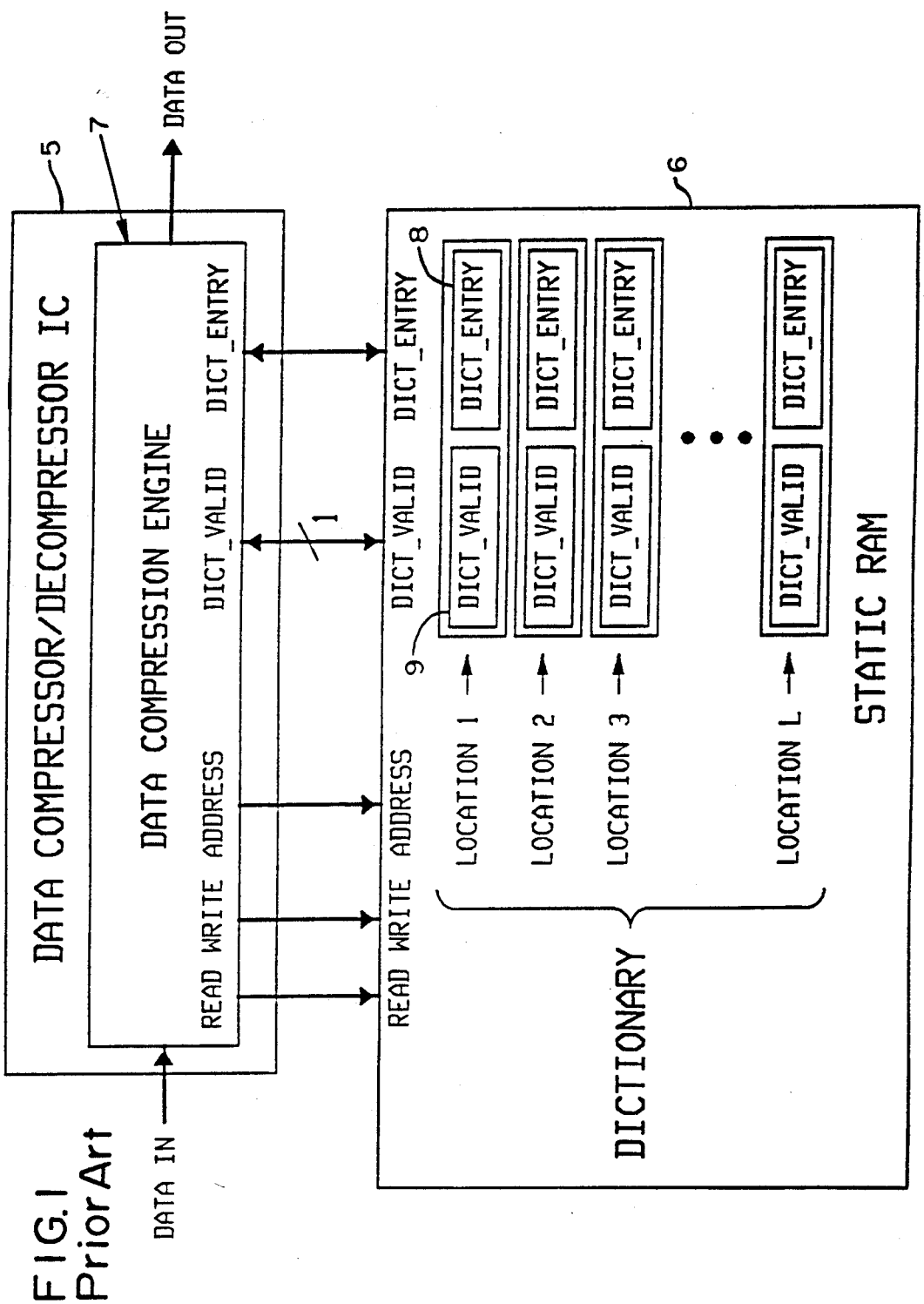
FIG. 1 is a block diagram of a typical conventional implementation of a data compression system employing the LZ2 algorithm.
Figure 2:
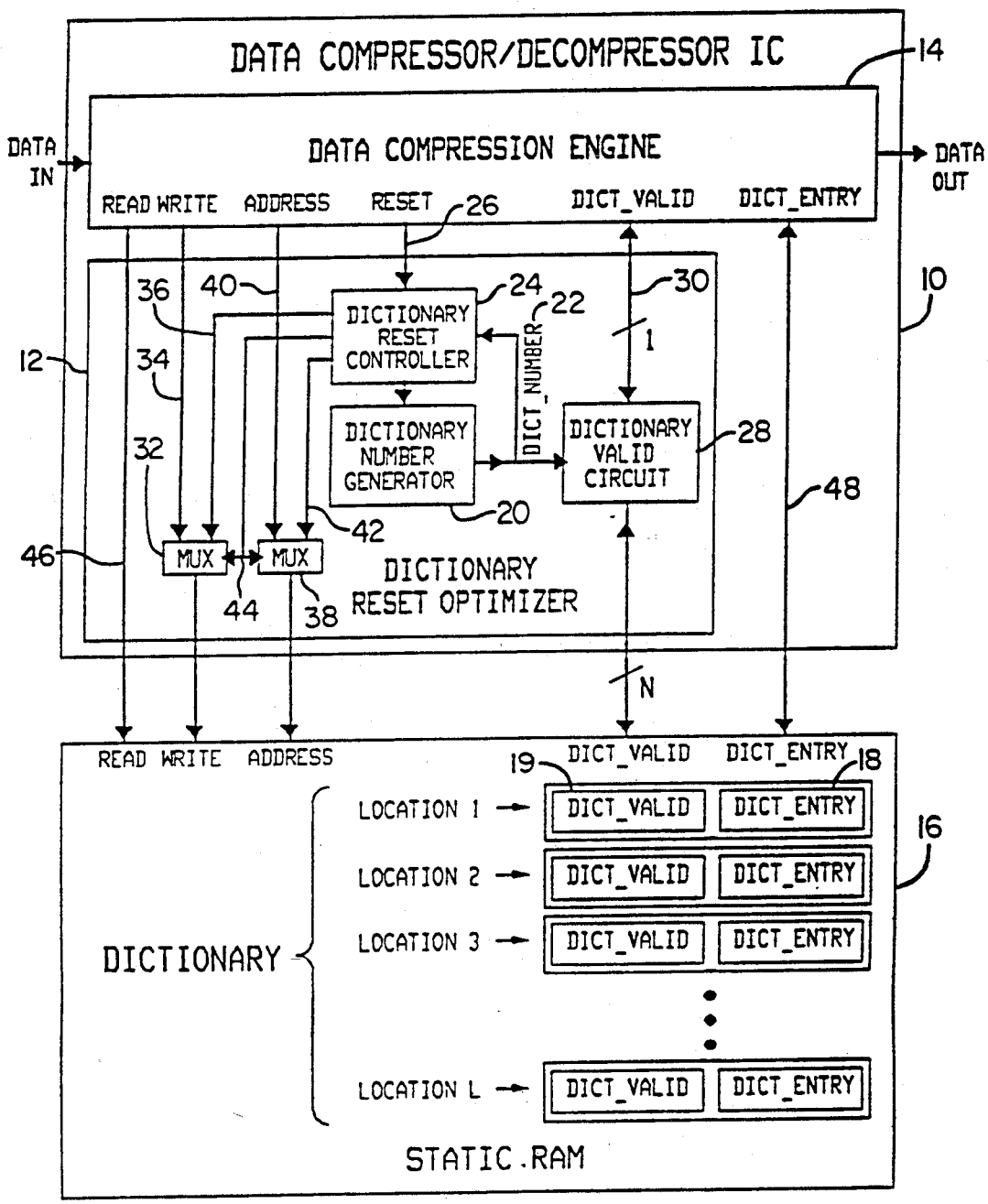
FIG. 2 is a block diagram of a data compression system with dictionary reset optimizer embodying the method and apparatus of the present invention.

FIG. 2 shows an example implementation of the invention in a data compressor/decompressor integrated circuit (IC) 10 which is a presently preferred embodiment. The data compressor/decompressor IC 10 includes a dictionary reset optimizer 12 in combination with a data compression engine 14. The dictionary reset optimizer 12 performs the dictionary reset operation, instead of the data compression engine 14. The data compressor/decompressor IC 10 is used in combination with a static RAM IC 16. The circuitry shown herein as conveniently implemented in two ICs 10 and 16 may alternatively be implemented in a single IC. The static RAM IC 16 is conventional. As used in the present invention, the static RAM includes L dictionary locations, each containing an M-bit DICT_ENTRY field 18 and an N-bit DICT_VALID field 19, where both M and N are integers greater than one.

The data compression engine 14 is preferably designed to implement the LZ2 compression algorithm, but can be designed to implement any suitable dictionary-based compression scheme. Also, if desired, the compression engine may incorporate or be used in conjunction with means for controlling when reset operations occur, such as disclosed in U.S. Pat. No. 4,847,619. Being otherwise conventional, the particular algorithm and architecture of the data compression engine need not be further described.

The dictionary reset optimizer 14 comprises three main subcircuits. The core subcircuit is a dictionary number generator 20. This subcircuit creates and outputs an N-bit DICT_NUMBER field 22. This subcircuit sequences through all the $2^N$ binary values for the DICT_NUMBER field. A typical implementation of this subcircuit is an N-bit binary counter but other forms of sequencers can be readily used.

The dictionary reset controller subcircuit 24 monitors dictionary reset request signals 26 which are output from the data compression engine 14 or from other circuitry associated with the data compressor/decompressor IC. The dictionary reset controller subcircuit monitors the DICT_NUMBER field 22 and determines how to process a reset request. When the DIC-T_NUMBER field is equal to a DEFAULT value, the dictionary reset controller writes the DEFAULT value to the DICT_VALID field in all dictionary locations (1, 2, 3, . . . L). The dictionary reset controller then sequences the dictionary number generator to the next binary value. On subsequent $(2^N-1)$ dictionary reset requests, the dictionary reset controller sequences the dictionary number generator through the remaining $(2^N-1)$ binary values, as described in the algorithm below.

Figure 3:
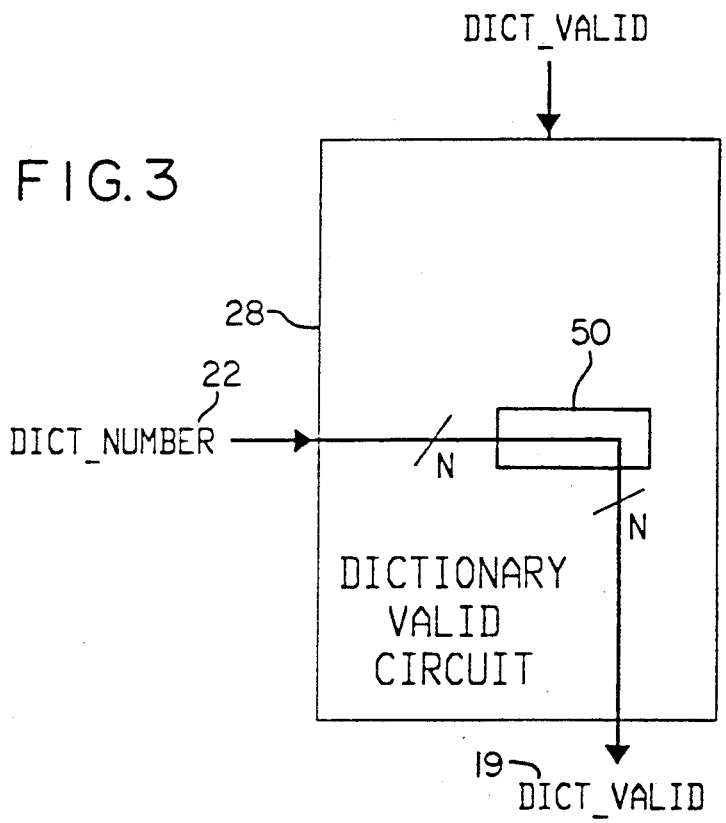
FIG. 3 is a block diagram of operation of the dictionary valid circuit of FIG. 2 during dictionary write cycles.

The third subcircuit is the dictionary valid circuit 28. This subcircuit handles the translation from a 1-bit DICT_VALID field 30 from the data compression engine 14 to the N-bit DICT_VALID field 19 in the dictionary locations (1, 2, 3, . . . L) in the static RAM 16. During dictionary write cycles, the N-bit DICT_VALID field 19 in the selected dictionary location is set equal to the N-bit DICT_NUMBER field 22. This operation is shown in FIG. 3. During dictionary read cycles, the N-bit DICT_VALID field 19 is compared to the N-bit DICT_NUMBER field 22. If these are equal, the data in the selected dictionary location is deemed to be in the valid state. If these values are not equal, the data in the selected dictionary location is deemed to be in the reset state. This operation is shown in FIG. 4.

Associated with the dictionary reset controller 24 is multiplexing circuitry. This circuitry includes a first multiplexer 32 which selects between write signals 34 and 36, respectively, from the data compression engine 12 and the dictionary reset controller 24. A second multiplexer 38 selects between address signals 40 and 42, respectively, from the data compression engine 12 and the dictionary reset controller 24. Both multiplexers are controlled by a select signal 44 from the dictionary reset controller. Together, these circuits operate, alternatively, to permit conventional writing to the dictionary locations from the data compression engine 12 during normal compression-decompression operations and enable writing to the dictionary locations from the dictionary reset controller during reset operations in accordance with the invention. Read lines 46 and DICT_ENTRY lines 48 are conventionally coupled between corresponding input/output ports of the data compression engine 12 and the static RAM 16.

Figure 4:
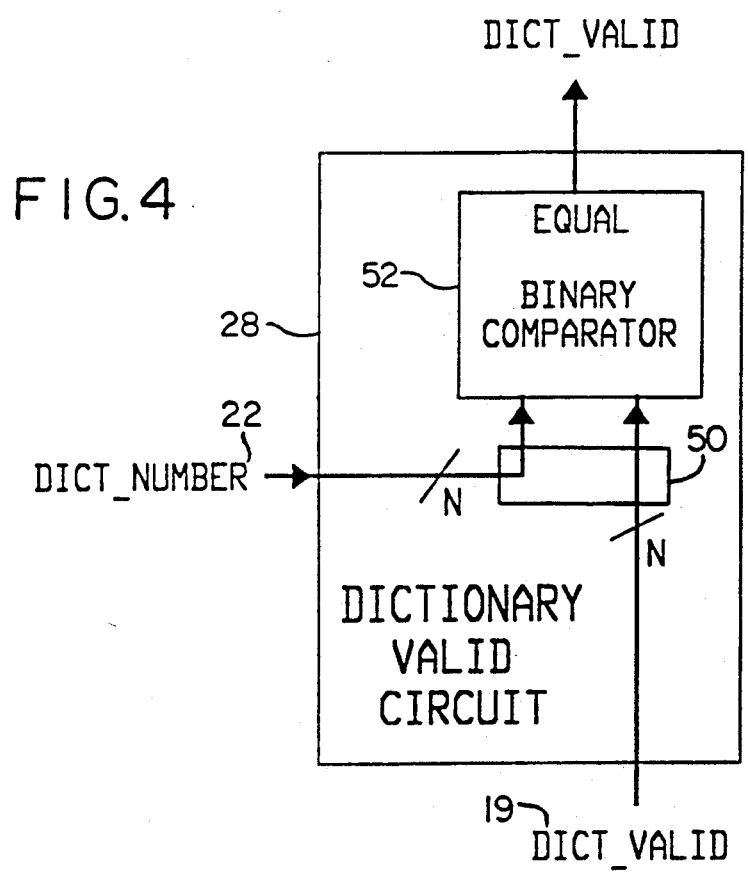
FIG. 4 is a block diagram of operation of the dictionary valid circuit of FIG. 2 during dictionary read cycles.

Further details of the dictionary valid circuit 28 are shown in FIGS. 3 and 4. Circuit 28 includes switching circuitry 50, which has two states, selection of which is controlled by the output of MUX 32. In the write state, shown in FIG. 3, the DICT_NUMBER field is written into the DICT_VALID field 19 of a selected location in the dictionary. In the read state, shown in FIG. 4, the DICT_VALID field 19 of a selected location in the dictionary is read and input to a binary comparator 52 along with the DICT_NUMBER field. The binary comparator determines whether the values of these two fields match.

INVENTION THEORY AND OPERATION

The multiple-bit DICT_VALID field 19 allows coding of the binary values in the field. One binary value is named DEFAULT. All the remaining binary values represent unique dictionary numbers. The number of bits in the DICT_VALID field is N, an integer of two or more. Thus, there are $2^N$ total binary values of DICT_VALID. There is one DEFAULT value, and $(2^N-1)$ dictionary number values.

The dictionary reset optimizer circuit 12 contains one binary value of the DICT_VALID field. This value is generated by the dictionary number generator 20 and is named DICT_NUMBER 22. The dictionary reset optimizer 12 has the ability to set the DICT_NUMBER value to any of the $2^N$ possible binary values. When the DICT_NUMBER value 22 in the dictionary reset optimizer does not match the DICT_VALID field in a selected dictionary location, e.g., their binary values are not equal, that dictionary location is defined to be in the reset state. When the DICT_NUMBER field in the dictionary reset optimizer 12 matches the DICT_VALID field in a selected dictionary location, e.g., their binary values are equal, that dictionary location is defined to be in the valid state.

The algorithm for the dictionary reset optimizer begins by setting the DICT_NUMBER field 22 equal to the DEFAULT value. This value is then written to the DICT_VALID fields 19 in all dictionary locations (1, 2, 3, . . . L). The DICT_NUMBER value is then sequenced to a new, unique binary value. Let this value be named DICT_NUMBER (1). When writing to a selected dictionary location, the corresponding DICT_VALID field is loaded with the DICT_NUMBER (1) value. When a dictionary entry is read, the DICT_VALID field is compared to the DICT_NUMBER (1) value in the dictionary reset optimizer. If the values are equal, the dictionary entry is valid. If the values are not equal, the dictionary entry is reset. (Note: equality of these values is the simplest and preferred form of match; others could be used.)

At the next dictionary reset, the DICT_NUMBER field 22 is then sequenced by the dictionary number generator 20 to a new, unique binary value. Let this value be named DICT_NUMBER (2). The DICT_VALID fields 19 in the dictionary all remain in their previous state; they are not immediately written to a different, reset value as in prior designs. Then, when each dictionary location is subsequently written to, the DICT_VALID field of such location is loaded with the DICT_NUMBER (2) value. When a dictionary entry is read, the DICT_VALID field 19 of such location is compared to the DICT_NUMBER (2) field 22 in the dictionary reset optimizer. If their values are equal, the dictionary entry is deemed valid. If their values are not equal, the dictionary entry is defined as being in the reset state. In this case, a new DICT_ENTRY is created by the data compression engine in accordance the selected compression/decompression algorithm and stored in the accessed dictionary location. At the same time, the new data entry in the DICT_ENTRY field is identified as being in a valid state by writing DICT_NUMBER (2) in the corresponding DICT_VALID field.

On each subsequent dictionary reset, the DICT_NUMBER field is sequenced to a new, and yet unused binary value. The DICT_VALID fields in the dictionary continue to remain in their previous state as a result of the reset. The dictionary write and read process continues as described above.

Once $2^N$ dictionary resets have occurred, all binary values in DICT_NUMBER have been used. There are no unused values remaining. At this point, the algorithm repeats. The DICT_NUMBER field 22 is set equal to the DEFAULT value. This value is then written to the DICT_VALID fields 19 in all dictionary locations. The DICT_NUMBER values then repeat sequencing through all the binary values at each dictionary reset.

The result of this procedure is that writing of the DEFAULT value to the DICT_VALID field in all dictionary locations occurs once every $(2^N-1)$ dictionary resets, instead of every dictionary reset. The value $(2^N-1)$ can be defined as the reset reduction factor.

Consider the case when multiple data files are to be compressed, with the dictionary being reset at boundaries between the individual files. Table 1 shows the reset reduction factors and average dictionary reset times for various number of bits in the DICT_VALID field 19. The first row in Table 1 shows the result in a conventional single-reset-bit system. The remaining entries show the results for implementations in which the DICT_VALID field contains 2, 3, 4 or 5 bits in accordance with the invention. The average reset time values were calculated assuming 16K dictionary locations, and 100 nsec access per dictionary location. Each added bit halves the average reset time.

TABLE 1

| Number of Bits | Reset Reduction Factor | Average Reset Time |
| --- | --- | --- |
| 1 | 1 | 1638 usec |
| 2 | 3 | 546 usec |
| 3 | 7 | 234 usec |
| 4 | 15 | 109 usec |
| 5 | 31 | 53 usec |

RAM 16 is conveniently implemented in a conventional 32K static RAM, with 3 bytes are allocated to each dictionary location (i.e. L=10K). It is presently preferred to allocate 3 bits in each location to DICT_VALID field 19 and 21 bits to the DICT_ENTRY field 18. This arrangement gives a resent reduction factor of 7 over the prior art.

Having illustrated and described the principles of my invention in a preferred embodiment thereof, it should be readily apparent to those skilled in the art that the invention can be modified in arrangement and detail without departing from such principles. For example, this invention could readily be implemented in a software compression/decompression system, wherein the dictionary is defined and stored in a data field in the program and the dictionary reset optimizer is implemented as a new module in existing data compression software.

I claim all modifications coming within the spirit and scope of the accompanying claims:

1. A dictionary-based data compressor/decompressor system comprising:

a memory device having L dictionary locations, each location including a first data field for storing a dictionary compression data entry to use in compressing/decompressing input data and a corresponding second data field for storing a dictionary status word comprising at least two binary digits indicating whether the corresponding dictionary data entry is in a valid or reset state;

a data compression engine having data input and output ports and input/output ports for reading and writing to the first and second fields of a selected location in the memory device, the data compression engine including means for compressing/decompressing input data and reading/writing dictionary data entries in the dictionary locations in accordance with a predetermined compression algorithm; and a dictionary reset optimizer coupled between the memory device and the data compression engine including:

means for generating a dictionary number comprising at least two binary digits; and means for comparing the dictionary number to the dictionary status word in one of said dictionary locations to determine whether they match in accordance with a predetermined relationship and thereby determine whether the corresponding dictionary data entry is in either a valid or reset state;

the data compression engine being responsive to the comparing means to read the dictionary compression data entry stored in the corresponding first data field if a valid state is determined and to write a new dictionary compression data entry into the corresponding first data field if a reset state is determined.

2. A dictionary-based data compressor/decompressor system according to claim 1 in which the comparing means is a binary comparator wherein the generated dictionary number and the stored dictionary status word are compared to determine whether they are equal.

3. A dictionary-based data compressor/decompressor system comprising:

a memory device having L dictionary locations, each location including a first data field for storing a dictionary compression data entry to use in compressing/decompressing input data and a corresponding second data field for storing a dictionary status word comprising at least two binary digits indicating whether the corresponding dictionary data entry is in a valid or reset state;

a data compression engine having data input and output ports and input/output ports for reading and writing to the first and second fields of a selected location in the memory device, the data compression engine including means for compressing/decompressing input data and reading/writing dictionary data entries in the dictionary locations in accordance with a predetermined compression algorithm; and a dictionary reset optimizer coupled between the memory device and the data compression engine including:

means for generating a dictionary number comprising at least two binary digits;

means for comparing the dictionary number to the dictionary status word in one of said dictionary locations to determine whether the corresponding dictionary data entry is in either a valid or reset state; and controller means responsive to a reset signal for causing the generating means to generate a new dictionary number so that the comparing means subsequently determines by comparison of the new dictionary number to a prior dictionary number stored in each dictionary location that the dictionary compression data entry stored in such location is in a reset state and causes the data compression engine to write a new dictionary compression data entry into the corresponding first data field and the new dictionary number into the second data field the data compression engine being responsive to the comparing means to read the dictionary compression data entry stored in the corresponding first data field if a valid state is determined and to write a new dictionary compression data entry into the corresponding first data field if a reset state is determined.

4. A dictionary-based data compressor/decompressor system according to claim 3 in which the data compression engine includes means for outputting the reset signal to the dictionary reset optimizer.

5. A dictionary-based data compressor/decompressor system according to claim 3 in which:

the memory device includes read, write and address inputs;

the data compression engine includes first write and address outputs;

the controller means includes second write and address outputs; and the dictionary reset optimizer includes means responsive to the controller means for selecting between the first and the second write and address outputs.

6. A dictionary-based data compressor/decompressor system
comprising:

a memory device having L dictionary locations, each location including a first data field for storing a dictionary compression data entry to use in compressing/decompressing input data and a corresponding second data field for storing a dictionary status word comprising at least two binary digits indicating whether the corresponding dictionary data entry is in a valid or reset state;

a data compression engine having data input and output ports and input/output ports for reading and writing to the first and second fields of a selected location in the memory device, and a single-bit output/input for transmitting/receiving a dictionary status signal to/from the memory device, the data compression engine including means for compressing/decompressing input data and reading/writing dictionary data entries in the dictionary locations in accordance with a predetermined compression algorithm; and a dictionary reset optimizer coupled between the memory device and the data compression engine including:

means for generating a dictionary number comprising at least two binary digits;

means for comparing the dictionary number to the dictionary status word in one of said dictionary locations to determine whether the corresponding dictionary data entry is in either a valid or reset state; and means interposed between the data compression engine and the memory device for translating between said single-bit output/input and said dictionary status word comprising at least two binary digits;

the data compression engine being responsive to the comparing means to read the dictionary compression data entry stored in the corresponding first data field if a valid state is determined and to write a new dictionary compression data entry into the corresponding first data field if a reset state is determined.

7. A dictionary reset optimizer for a resettable dictionary-based data compressor/decompressor system which includes a memory device having L dictionary locations, each location storing a dictionary data entry and an N-bit dictionary status word, and a data compression engine for reading/writing dictionary data entries in the dictionary locations to compress/decompress input data in accordance with a predetermined compression algorithm, the dictionary reset optimizer comprising:

a dictionary number generator for generating an N-bit dictionary number, N being an integer equal to or greater than 2;

a dictionary-valid determining means including a binary comparator for comparing the N-bit dictionary number to the N-bit dictionary status word in one of said dictionary locations to determine whether or not the dictionary number and the dictionary status word match in accordance with a predetermined relationship and providing an output signal to indicate to the data compression engine whether the data entry in said one location is valid based on whether the dictionary number and the dictionary status word match; and controller means responsive to a reset condition for causing the generating means to generate a new dictionary number so that the new dictionary number does not match a prior dictionary number stored in each dictionary location.

8. A dictionary reset optimizer according to claim 7 in which the dictionary number generator includes a binary sequencer which outputs the N-bit dictionary number.

9. A dictionary reset optimizer according to claim 8 in which the controller means includes an output to the dictionary number generator which causes the binary sequencer to sequence the N-bit dictionary number.

10. A dictionary reset optimizer according to claim 7 in which the dictionary-valid determining means is operable in two states: a write state in which the N-bit dictionary number is written into the N-bit dictionary status word in one of said dictionary locations and a read state in which the N-bit dictionary status word of a selected location in the dictionary is read and input to the binary comparator.

11. A dictionary reset optimizer according to claim 7 in which the dictionary-valid determining means includes switching circuitry selectably operable to read and input the N-bit dictionary status word stored in a selected dictionary location and the N-bit dictionary number to the binary comparator, and to write the N-bit dictionary number into the N-bit dictionary status word in the selected dictionary location if the dictionary number does not match the stored dictionary status word.

12. A dictionary reset optimizer according to claim 11 including write-selection means having an output controllably coupled to the switching circuitry.

13. A dictionary reset optimizer according to claim 7 including write-selection means having a first write input from the data compression engine and a second write input from the controller means for providing one of said write inputs as an output signal selectable by the controller means.

14. A dictionary reset optimizer according to claim 7 including address-selection means having a first address input from the data compression engine and a second address input from the controller means for providing one of said address inputs as an output signal selectable by the controller means.

15. A dictionary reset optimization method for resetting a dictionary-based data compressor/decompressor system which includes a memory having L dictionary locations each including a multibit dictionary data entry field, and a data compression engine for reading/writing dictionary data entries in the dictionary locations to compress/decompress input data in accordance with a predetermined compression algorithm, the optimization method comprising:

allocating storage in each of the L dictionary locations to include an N-bit dictionary status field, N being an integer equal to or greater than 2;

generating a first N-bit dictionary number;

storing the dictionary number as a dictionary status word in association with a compression data entry in one or more of the L dictionary locations;

reading a dictionary status word stored in the dictionary status field of a selected one of the L dictionary locations;

comparing the dictionary number to the dictionary status word to determine whether or not the dictionary number and the dictionary status word match in accordance with a predetermined relationship;

signalling to the data compression engine whether the data entry in said one location is valid based on whether the dictionary number and the dictionary status word match; and responsive to a reset condition, generating a second N-bit dictionary number so that the second dictionary number does not match the stored first dictionary number.

16. A method according to claim 15 wherein the dictionary number and the dictionary status word of a selected one of the L dictionary locations match in the comparing step, including:

reading the compression data entry stored in the data entry field of the selected dictionary location; and using the stored data entry to compress/decompress input data in accordance with said predetermined compression algorithm.

17. A method according to claim 15 wherein the dictionary number and the dictionary status word of a selected one of the L dictionary locations do not match in the comparing step, including:

writing a new compression data entry in the data entry field of the selected dictionary location for subsequent use in compressing/decompressing input data in accordance with said predetermined compression algorithm; and writing the second dictionary number dictionary status word in the dictionary status field of the selected dictionary location.

18. A method according to claim 17 including, immediately following generation of a second N-bit dictionary number, repeating the storing, reading, comparing and writing steps using the second N-bit dictionary number so that the dictionary is rebuilt.

19. A method according to claim 15 including:

repeating the reading and comparing steps using the first N-bit dictionary number until a reset condition has occurred; and immediately following occurrence of a reset condition and generation of a second N-bit dictionary number, repeating the storing, reading and comparing steps using the second N-bit dictionary number without first writing the second N-bit dictionary number in each of the L dictionary locations.

20. A method according to claim 15, responsive to each of $2^n-1$ reset conditions, including sequencing through $2^n-1$ values of the N-bit dictionary number and repeating the storing, reading and comparing steps using each sequential dictionary number.

21. A method according to claim 20, responsive to a $2^n$th reset condition, including sequencing the N-bit dictionary number to a default value of the dictionary number and writing said default value as the dictionary status word in the dictionary status field in each of the L dictionary locations.

* * * * *